United States Patent
Otsuka

(10) Patent No.: US 9,231,654 B2
(45) Date of Patent: Jan. 5, 2016

(54) TRANSMISSION SYSTEM AND CONTROL METHOD OF SAME

(71) Applicant: Kabushiki Kaisha Toshiba, Minato-ku (JP)

(72) Inventor: Kuniaki Otsuka, Tokyo (JP)

(73) Assignee: Kabushiki Kaisha Toshiba, Minato-ku (JP)

( * ) Notice: Subject to any disclaimer, the term of this patent is extended or adjusted under 35 U.S.C. 154(b) by 0 days.

(21) Appl. No.: 14/477,419

(22) Filed: Sep. 4, 2014

(65) Prior Publication Data

US 2014/0370829 A1    Dec. 18, 2014

Related U.S. Application Data

(63) Continuation of application No. PCT/JP2013/000488, filed on Jan. 30, 2013.

(30) Foreign Application Priority Data

Mar. 15, 2012  (JP) .................................. 2012-058976

(51) Int. Cl.
| | | |
|---|---|---|
| H04B 1/02 | (2006.01) | |
| H04B 1/74 | (2006.01) | |
| H04B 1/04 | (2006.01) | |
| H03F 1/02 | (2006.01) | |

(Continued)

(52) U.S. Cl.
CPC ................ H04B 1/74 (2013.01); H03F 1/0277 (2013.01); H03F 1/3247 (2013.01); H03F 3/195 (2013.01);

(Continued)

(58) Field of Classification Search
CPC ........... H04B 1/0483; H04B 1/74; H04B 1/04
USPC .............. 455/91, 103, 114.3, 127.1; 375/295, 375/296
See application file for complete search history.

(56) References Cited

U.S. PATENT DOCUMENTS

| | | | |
|---|---|---|---|
| 2009/0124279 A1* | 5/2009 | Guerra .................. | H04W 24/04 455/525 |
| 2009/0186585 A1* | 7/2009 | Ahrony ................ | H04B 7/0689 455/101 |
| 2013/0128778 A1* | 5/2013 | Bennett ................. | H04W 36/08 370/277 |

FOREIGN PATENT DOCUMENTS

| | | |
|---|---|---|
| JP | 11-298381 | 10/1999 |
| JP | 2001-245805 | 9/2001 |
| JP | 2005-20373 | 1/2005 |

OTHER PUBLICATIONS

International Preliminary Report on Patentability and Written Opinion issued Sep. 25, 2014, in International Application No. PCT/JP2013/000488 (with English translation.

*Primary Examiner* — Tuan Pham
(74) *Attorney, Agent, or Firm* — Oblon, McClelland, Maier & Neustadt, L.L.P.

(57) ABSTRACT

A transmission system of an embodiment is provided with an active transmitter, a backup transmitter, and a system controller to integrally control the active transmitter and the backup transmitter. The backup transmitter is provided with a setting table which stores a setting value relating to a frequency and a level of a signal outputted from the active transmitter, a power amplifier to amplify an input signal and output an amplified signal, and a modulator/exciter which converts, based on the setting table, the input signal into a modulation signal of a prescribed broadcast type in which nonlinear distortion by the power amplifier has been compensated. The system controller, at the time of adjusting the output level of the active transmitter, controls the backup transmitter so that content of the setting table of the backup transmitter becomes a setting value corresponding to the adjusted output level.

9 Claims, 5 Drawing Sheets

(51) Int. Cl.
*H03F 3/195* (2006.01)
*H04B 7/02* (2006.01)
*H03F 1/32* (2006.01)
*H03F 3/24* (2006.01)

(52) U.S. Cl.
CPC .............. *H03F 3/245* (2013.01); *H04B 1/0475* (2013.01); *H04B 1/0483* (2013.01); *H04B 7/022* (2013.01); *H04B 2001/045* (2013.01); *H04B 2001/0425* (2013.01)

TRANSMISSION SYSTEM AND CONTROL METHOD OF SAME

CROSS-REFERENCE TO RELATED APPLICATION

This application is based upon and claims the benefit of priority from the prior Japanese Patent Application No. 2012-058976, filed on Mar. 15, 2012; the entire contents of which are incorporated herein by reference. This application is a continuation application of International Application No. PCT/JP2013/000488, file on Jan. 30, 2013.

FIELD

Embodiments of the present invention relate to a transmission system and a control method of the same.

BACKGROUND

Conventional transmission systems for broadcasting have each a backup transmitter for backup, in many cases, in addition to a transmitter to be used for actual broadcasting, in order to secure the redundancy of a transmission apparatus. As one of the simplest systems, there is an active/backup system which has one backup transmitter for one transmitter. In this system, the number of required backup transmitters is equal to the number of transmitters. For this reason, in the case of a broadcast station having a plurality of transmitters, a lot of backup transmitters are required, and thereby the burden of capital investment thereof becomes large. As one means to suppress the burden of capital investment and secure a backup transmitter, there is an (N+1) system which has one backup transmitter for a plurality of transmitters.

At the time of switching to a backup transmitter, switching is performed so that an input signal is inputted to the backup transmitter, and an output signal from the backup transmitter is outputted. In an (N+1) system, since the backup transmitter becomes a backup for not less than two transmitters, change in a frequency and an output level and so on is required, at the time of switching. At this time, since the frequency is previously known, it is possible to previously adjust the backup transmitter in accordance with the frequency.

In addition, it is possible to previously adjust the output level similarly, but the output level may be changed during operation. When the output level is changed, at the time of switching to the backup transmitter, it becomes necessary to adjust the output level in accordance with the change.

In addition, in a digital transmitter, in order to compensate nonlinear distortion of the amplifier, there is a case to perform control for compensation of the nonlinear distortion, by feeding back an output signal of the amplifier. In this case, when the output level fluctuates, it is necessary to perform adjustment again in accordance with the fluctuation.

As described above, in the conventional art, when adjustment of an output level of a transmitter is performed during operation, adjustment of the output level is required at the time of switching to a backup transmitter.

In addition, when nonlinear distortion compensation of a feedback system is performed, it is necessary to perform switching after the setting in accordance with adjustment of a feedback level and the changed nonlinear distortion characteristic is performed. For this reason, when adjustment of an output level of a transmitter is performed during operation, there was a problem that a switching time is excessively required.

DETAILED DESCRIPTION

A transmission system of an embodiment is provided with an active transmitter, a backup transmitter, and a system controller to integrally control the active transmitter and the backup transmitter. The backup transmitter is provided with a setting table which stores a setting value relating to a frequency and a level of a signal outputted from the active transmitter, a power amplifier to amplify an input signal and output an amplified signal, and a modulator/exciter which converts, based on the setting table, the input signal into a modulation signal of a prescribed broadcast type in which nonlinear distortion by the power amplifier has been compensated. The system controller, at the time of adjusting the output level of the active transmitter, performs control of the backup transmitter so that content of the setting table becomes a setting value corresponding to the adjusted output level.

Hereinafter, the present embodiment will be described.

First Embodiment

Figure 1:
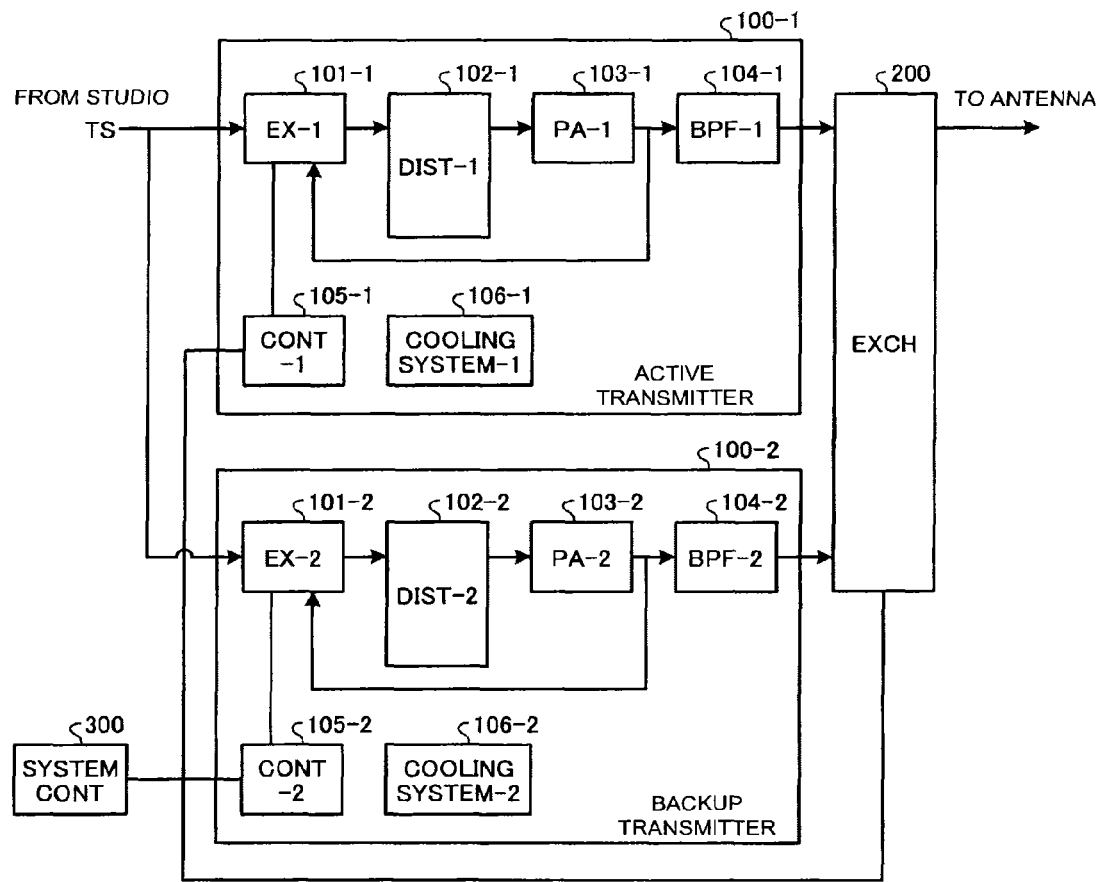
FIG. 1 is a block diagram showing a configuration of a transmission system according to a first embodiment.

A configuration of a transmission system of a first embodiment will be described using FIG. 1. FIG. 1 is a block diagram showing a configuration of the transmission system according to the first embodiment.

The transmission system of the present embodiment is based on a transmission system of a so-called active/backup system. The transmission system has an active transmitter 100-1, a backup transmitter 100-2, a switch 200, and a system controller 300. The backup transmitter 100-2 has the similar hardware configuration as the hardware configuration of the active transmitter 100-1.

The active transmitter 100-1 has a modulator/exciter 101-1, a distributor 102-1, a power amplifier 103-1, a band-pass filter 104-1, a control unit 105-1, and a cooling system 106-1.

In addition, the backup transmitter 100-2 has a modulator/exciter 101-2, a distributor 102-2, a power amplifier 103-2, a band-pass filter 104-2, a control unit 105-2, and a cooling system 106-2.

The modulator/exciter 101-1, the distributor 102-1, the power amplifier 103-1, the band-pass filter 104-1, the control unit 105-1, and the cooling system 106-1 respectively correspond to the modulator/exciter 101-2, the distributor 102-2, the power amplifier 103-2, the band-pass filter 104-2, the control unit 105-2, and the cooling system 106-2.

Hereinafter, the configuration of the active transmitter 100-1 will be described.

The modulator/exciter 101-1 has a function of a modulator and a function of an exciter.

The function of the modulator is to modulate a digital video/audio signal (here, a TS (Transport Stream) signal) inputted from a studio side into a signal of a prescribed broadcast type (a digital broadcast signal according to an ISDB-T (Integrated Services Digital Broadcasting-Terrestrial) system).

The function of the exciter is to compensate nonlinear distortion occurring in the power amplifier described below by a digital predistortion system, and convert a frequency of modification signal into a transmission frequency of a UHF band.

In the following description, the modulator/exciter may simply be called the exciter.

This modulator/exciter 101-1 has a setting table to store setting values relating to a frequency and a level and so on of a signal outputted from the transmitter, and performs signal conversion including compensation of the nonlinear distortion to an input signal, based on this setting table. That is, the modulator/exciter 101-1 converts an input signal into a modulation signal of a prescribed broadcast type in which the nonlinear distortion by the power amplifier has been compensated. This setting table works also as a compensation table for distortion compensation. Furthermore, in this embodiment, an example is shown in which the modulator/exciter 101-1 has the setting table, but the setting table is not limited to this. It is only necessary that the setting table is provided inside the active transmitter 100-1.

In addition, in order to correspond to various broadcast types and so on, a plurality of the modulator/exciter 101-1 may be provided. In such a case, these modulators/exciters 101-1 are switched, and thereby it becomes possible to correspond to a plurality of broadcast types and so on.

The power amplifier 103-1 amplifies an inputted modulation signal of a UHF band and outputs an amplified signal. In addition, power amplifiers 103-1 can be provided for respective prescribed output levels, and it is possible to change the output level, by switching the power amplifiers 103-1, or by composing outputs of a plurality of the power amplifiers 103-1.

When the modulators/exciters 101-1 and the power amplifiers 103-1 are respectively provided by a plural number as described above, the distributor 102-1 performs switching and distribution for supplying a signal from any one of a plurality of the modulators/exciters 101-1 to any one of a plurality of the power amplifiers 103-1.

The band-pass filter 104-1 performs band limitation to the output signal of the UHF band which has been amplified by the power amplifier 103-1, in accordance with the designated channel. An output signal of the band-pass filter 104-1 is sent to an antenna.

The control unit 105-1 is one function unit of a controller which integrally controls the active transmitter 100-1.

The cooling system 106-1 cools the power amplifier 103-1 with water or the like.

The active transmitter 100-1 and the backup transmitter 100-2 are connected to the switch 200, and the switch 200 selectively outputs an output signal of one of the transmitters.

The system controller 300 integrally controls the active transmitter, the backup transmitter, the transmission system, and performs various settings and gives necessary instruction to the active transmitter 100-1 and the backup transmitter 100-2, and in addition, performs switching control of the switch 200.

Figure 2:
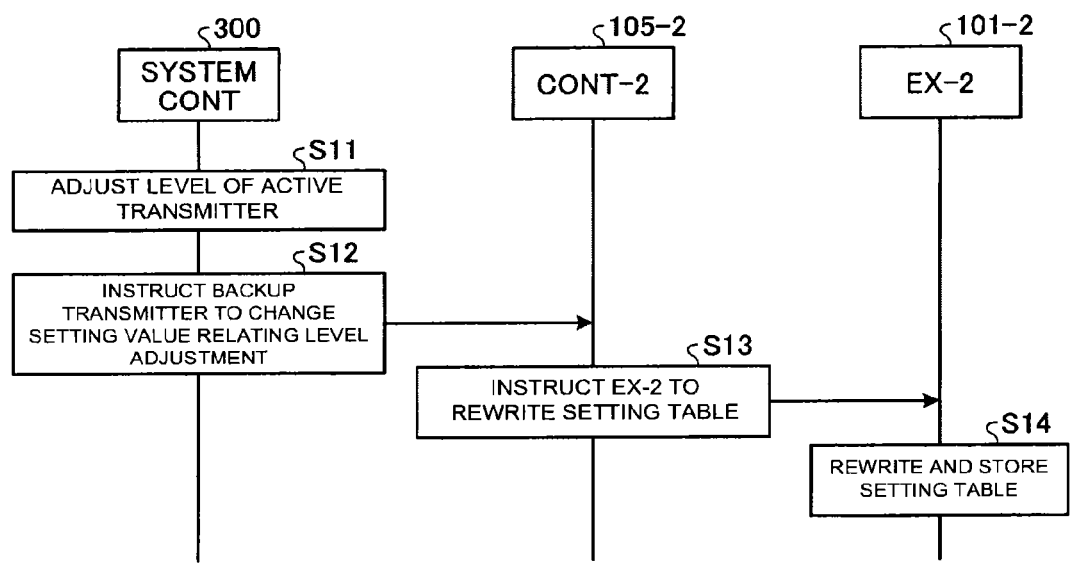
FIG. 2 is a sequence diagram for explaining an operation of the transmission system of the present embodiment.

An operation of the transmission system of the present embodiment will be described with reference to FIG. 2. FIG. 2 is a sequence diagram for explaining an operation of the transmission system of the present embodiment.

In the transmission system for digital broadcasting, level adjustment of an output is sometimes performed during operation. Level adjustment of the active transmitter 100-1 is performed during operation through the system controller 300 (step S11). In addition, when the system controller 300 performs level adjustment of the active transmitter 100-1 during operation, the system controller 300 outputs an instruction to the active transmitter 100-1, so as to change the content of the setting table to a setting value in accordance with the level adjustment. In the active transmitter 100-1, in accordance with the instruction, the control unit 105-1 of the active transmitter 100-1 outputs an instruction to the modulator/exciter 101-1 so as to rewrite the content of the setting table of the modulator/exciter 101-1 to the setting value in accordance with the level adjustment. And, the modulator/exciter 101-1, in accordance with the instruction of the control unit 105-1, rewrites the content of the setting table and stores the rewritten setting table. At this time, when the nonlinear compensation characteristic changes because the output level of the active transmitter 100-1 changes, the re-setting of the setting table therefor is also performed. And, the modulator/exciter 101-1 performs signal conversion including compensation of the nonlinear distortion to the input signal, based on the setting value stored in the setting table.

Furthermore, the system controller 300 outputs an instruction to the backup transmitter 100-2 so as to change the content of the setting table of the backup transmitter 100-2 to the setting value in accordance with the level adjustment of the active transmitter, that is, the setting value stored in the setting table of the active transmitter 100-1 (step S12).

In the backup transmitter 100-2, in accordance with the instruction, the control unit 105-2 of the backup transmitter 100-2 outputs an instruction to the modulator/exciter 101-2 so as to rewrite the content of the setting table of the modulator/exciter 101-2 to the setting value in accordance with the level adjustment of the active transmitter (step S13).

The modulator/exciter 101-2, in accordance with the instruction of the control unit 105-2, rewrites the content of the setting table and stores the rewritten setting table (step S14). At this time, when the nonlinear compensation characteristic changes because the output level of the active transmitter 100-1 changes, the re-setting of the setting table therefor is also performed. In addition, at an initial stage, the setting value of the setting table in the active transmitter 100-1 which is previously known is set in the setting table of the modulator/exciter 101-2.

And, when the switching from the active transmitter 100-1 to the backup transmitter 100-2 is performed, the modulator/exciter 101-2 performs signal conversion including the compensation of the nonlinear distortion to an input signal, based on the setting value stored in the setting table.

In the transmission system of the present embodiment, when the level adjustment for the active transmitter during operation is made, the setting value related to the level adjustment of the setting table of the modulator/exciter 101-2 is rewritten every time. By this means, since the backup transmitter 100-2 can immediately be functioned at any time, in the same state as the active transmitter at that time, it is possible to quickly perform switching from the active transmitter 100-1 to the backup transmitter 100-2 at any time.

In addition, in place of the band-pass filters 104-1, 104-2 inside the respective transmitters 100-1, 100-2, a band-pass filter may be provided at the later stage of the switch 200.

Second Embodiment

Figure 3:
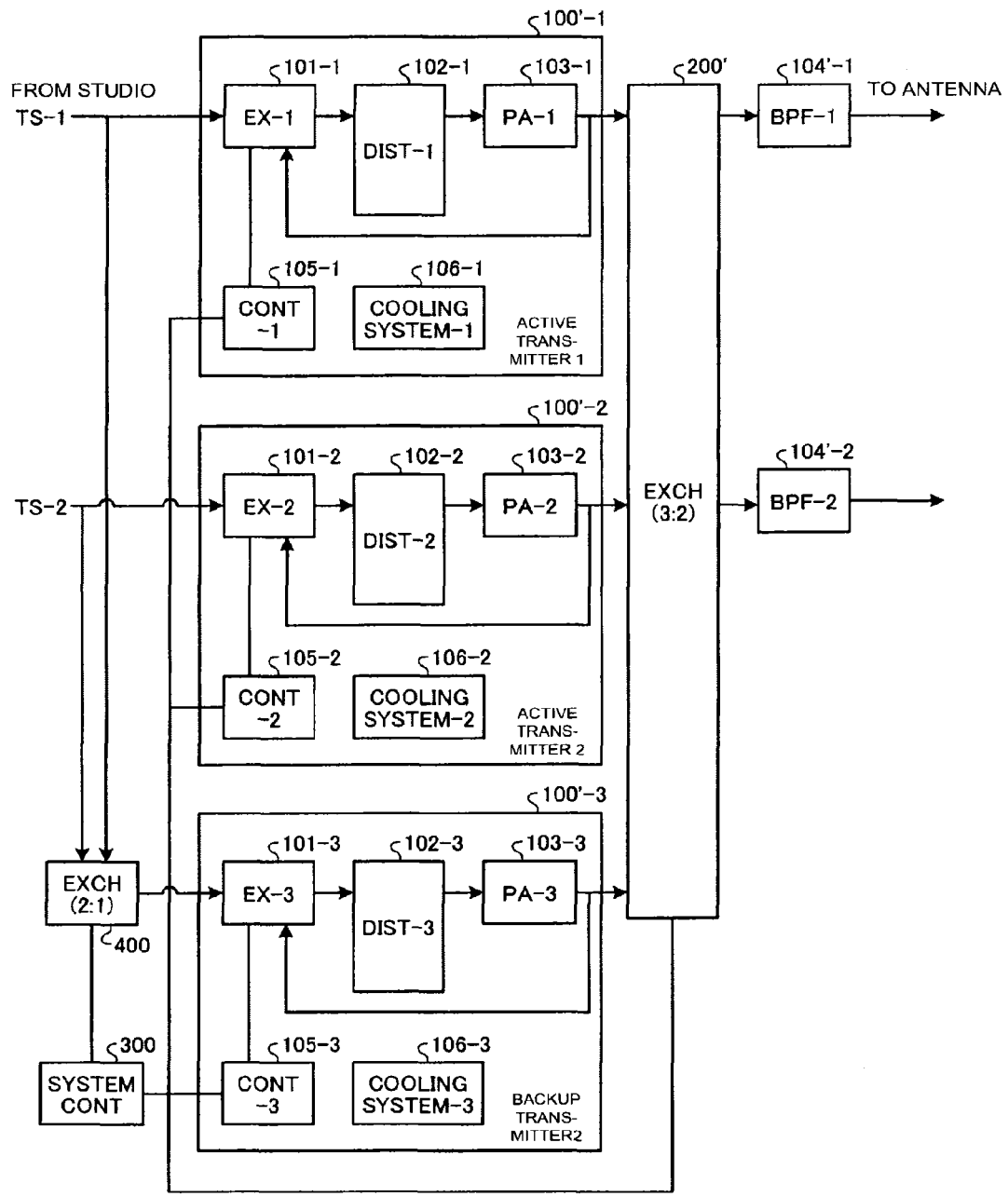
FIG. 3 is a block diagram showing a configuration of a transmission system according to a second embodiment.

Subsequently, a configuration of a transmission system of a second embodiment will be described with reference to FIG. 3. FIG. 3 is a block diagram showing a configuration of the transmission system according to the second embodiment.

The transmission system of the present embodiment is based on a transmission system of a so-called (N+1) system. In FIG. 3, the transmission system has two active transmitters 100'-1, 100'-2, and a backup transmitter 100'-3, a switch 200', the system controller 300, a switch 400, and band-pass filters 104'-1, 104'-2. In addition, the number of the active transmitters is not limited to two.

Each of the active transmitter 100'1, the active transmitter 100'-2 and the backup transmitter 100'-3 has the similar hardware configuration. The active transmitter 100'-1, the active transmitter 100'-2, and the backup transmitter 100'-3 have the similar hardware configurations as the active transmitter 100-1, and the backup transmitter 100-2 in the above-described first embodiment, respectively, except that the band-pass filters 104'-1, 104'-2 are provided outside the respective transmitters.

Here, the description of the portions common to the first embodiment and the second embodiment will be omitted, and the different portions between the first embodiment and the second embodiment will be described. In addition, the modulator/exciter 101-1, the distributor 102-1, the power amplifier 103-1, the band-pass filter 104-1, the control unit 105-1, and the cooling system 106-1 respectively correspond to the modulator/exciter 101-2 and a modulator/exciter 101-3, the distributor 102-2 and a distributor 102-3, the power amplifier 103-2 and a power amplifier 103-3, the band-pass filter 104-2, the control unit 105-2 and a control unit 105-3, and the cooling system 106-2 and a cooling system 106-3.

The active transmitter 100'-1, the active transmitter 100'-2, and the backup transmitter 100'-3 are connected to the switch 200', and the switch 200' selectively outputs the output signals of the two transmitters. Normally, the switch 200' outputs the output signals of the active transmitter 100'-1 and the active transmitter 100'-2. When one of the active transmitter 100'-1 and active transmitter 100'-2 is switched to the backup transmitter 100'-3, the switch 200' switches the connection so as to output the output signal of the backup transmitter 100'-3 in place of the output signal of the active transmitter to be switched. This switching control is performed by the system controller 300.

In addition, the switch 400 receives video/audio signals TS-1, TS-2 of two systems which are respectively supplied from the studio side to the active transmitter 100'-1 and the active transmitter 100'-2, and selectively outputs one of the received input signals. When one of the active transmitter 100'-1 and the active transmitter 100'-2 is switched to the backup transmitter 100'-3, the switch 400 switches the connection so as to supply the video/audio signal which has been supplied to the active transmitter to be switched to the backup transmitter 200. This switching control is performed by the system controller 300.

In addition, the modulator/exciter 101-3 of the backup transmitter 100'-3 in the present embodiment has a setting table corresponding to the active transmitter 100'-1, and a setting table corresponding to the active transmitter 100'-2. That is, in the system configuration having N active transmitters, the modulator/exciter 101-3 has N setting tables respectively corresponding to the N active transmitters. In addition, in the present embodiment, the band-pass filters 104'-1, 104'-2 are provided outside the transmitters, respectively. But the band-pass filters may be provided inside the transmitters, respectively, similarly as the first embodiment.

Figure 4:
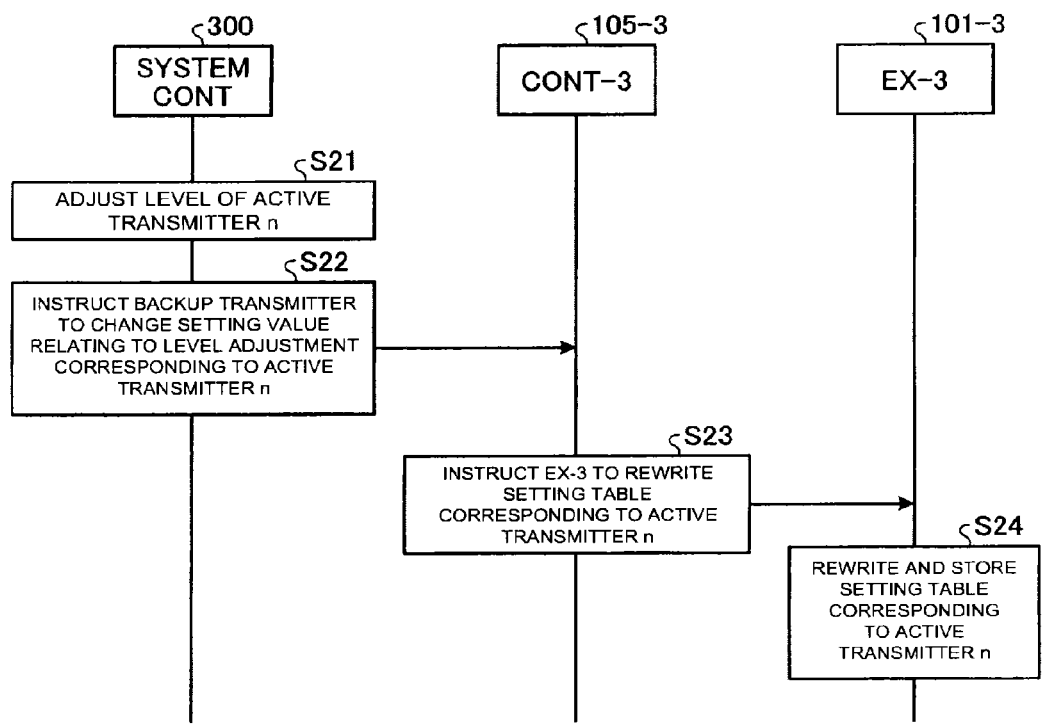
FIG. 4 is a sequence diagram for explaining an operation of the transmission system of the present embodiment.

An operation of the transmission system of the present embodiment will be described with reference to FIG. 4. FIG. 4 is a sequence diagram for explaining an operation of the transmission system of the present embodiment.

When level adjustment of any of the active transmitters (in the following description, it is assumed that this active transmitter is the active transmitter n) is performed during operation through the system controller 300 (step S21), in the transmission system of the present embodiment, the system controller 300 outputs an instruction to the backup transmitter 100'-3 so as to change the content of the setting table of the backup transmitter 100'-3 corresponding to the active transmitter n to the setting value in accordance with the level adjustment of the active transmitter n (step S22).

In the backup transmitter 100'-3, in accordance with the instruction, the control unit 105-3 of the backup transmitter 100'-3 outputs an instruction to the modulator/exciter 101-3 so as to rewrite the content of the setting table corresponding to the active transmitter n to the setting value in accordance with the level adjustment of the active transmitter n (step S23).

The modulator/exciter 101-3, in accordance with the instruction of the control unit 105-3, rewrites the content of the setting table corresponding to the active transmitter n and stores the rewritten setting table (step S24). At this time, when the nonlinear compensation characteristic changes because the output level of the active transmitter n changes, the re-setting of the setting table therefor is performed. In addition, at an initial stage, it is assumed that the setting value stored in the setting table in each of the active transmitters, which is previously known, is set in each of the setting tables of the modulator/exciter 101-3 of the backup transmitter 100'-3, that is the setting table corresponding to each of the active transmitters.

In the transmission system of the present embodiment, as described above, when the level adjustment to the active transmitter n during operation is performed, the content of the setting table of the modulator/exciter 101-3 of the backup transmitter 100'-3 corresponding to the active transmitter n is rewritten every time.

Figure 5:
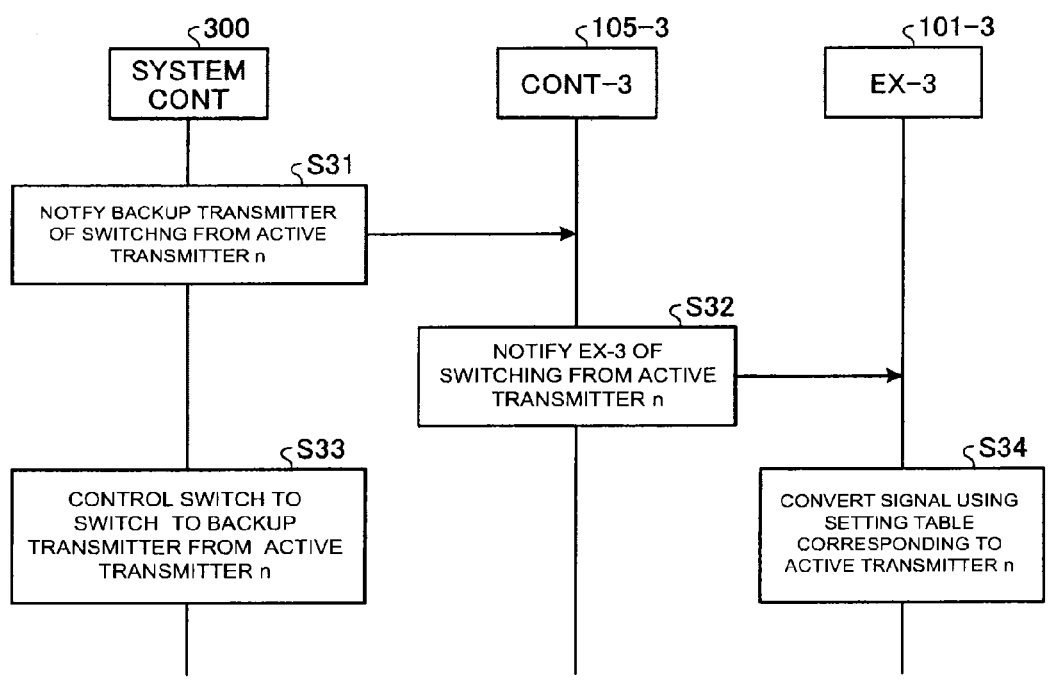
FIG. 5 is a sequence diagram for explaining an operation at the time of switching of the transmission system of the present embodiment.

Next, an operation when the switching from the active transmitter n to the backup transmitter 100'-3 is performed will be described using FIG. 5. FIG. 5 is a sequence diagram for explaining an operation at the time of switching of the transmission system of the present embodiment.

When the switching is performed, the system controller 300 notifies the backup transmitter 100'-3 of the switching from the active transmitter n (step S31).

The control unit 105-3 of the backup transmitter 100'-3 which has received the above-described notice from the system controller 300 notifies the modulator/exciter 101-3 of the switching from the active transmitter n (step S32).

And, the system controller 300 controls the switch 400 and the switch 200' so as to switch from the active transmitter n to the backup transmitter 100'-3 (step S33).

On the other hand, the modulator/exciter 101-3 performs signal conversion including the compensation of the nonlinear distortion to the input signal, using the setting value stored in the setting table corresponding to the active transmitter n (step S34).

With the above-described control, at the time of switching to the backup transmitter 100'-3, since the backup transmitter 100'-3 can be quickly functioned in the same state as the active transmitter n to be switched, it is possible to quickly perform switching from the active transmitter n to the backup transmitter 100'-3 at any time.

As described above, in the transmission system of an active/backup system in the first embodiment, and in the transmission system of an (N+1) system in the second embodiment, when a transmission output level of the active transmitter is changed during operation, the content of the above-described setting table is also changed in the backup transmitter, in accordance with this change. By this means, at the time of switching to the backup transmitter, the new information stored in the setting table can be applied, and thereby it becomes possible to shorten the switching time. As a result, switching from the active transmitter to the backup transmitter can be quickly performed.

While certain embodiments of the present invention have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A transmission system comprising:
an active transmitter;
a backup transmitter comprising a setting table which stores a setting value relating to a frequency and a level of a signal outputted from the active transmitter, a power amplifier to amplify an input signal and output an amplified signal, and a modulator/exciter which, based on the setting table, converts the input signal into a modulation signal of a prescribed broadcast type in which nonlinear distortion by the power amplifier has been compensated; and
a system controller which integrally controls the active transmitter and the backup transmitter, and at the time of adjusting the output level of the active transmitter, performs control of the backup transmitter so that content of the setting table becomes a setting value corresponding to the output level of the active transmitter adjusted.

2. The transmission system according to claim 1, wherein: the backup transmitter has a control unit which changes the content of the setting table in accordance with the control of the system controller.

3. The transmission system according to claim 2, wherein: the modulator/exciter has the setting table, and the modulator/exciter changes the content of the setting table by an instruction of the control unit.

4. The transmission system according to claim 1, wherein the active transmitter comprises:
a power amplifier for the active transmitter to amplify an input signal for the active transmitter and output an amplified signal;
a setting table for the active transmitter which stores the setting value for the active transmitter relating to the frequency and the level of the signal outputted from the active transmitter;
a modulator/exciter for the active transmitter which, based on the setting table for the active transmitter, converts the input signal for the active transmitter into a modulation signal of a prescribed broadcast type in which nonlinear distortion by the power amplifier for the active transmitter has been compensated; and
a control unit for the active transmitter which changes content of the setting table for the active transmitter based on the control of the system controller;
wherein the system controller, at the time of adjusting the output level of the active transmitter, performs control of the active transmitter so that the content of the setting table for the active transmitter becomes a prescribed setting value.

5. A transmission system comprising:
a plurality of active transmitters;
a backup transmitter comprising a plurality of setting tables corresponding to the plurality of active transmitters each of which stores a setting value relating to a frequency and a level of a signal outputted from the active transmitter, a power amplifier to amplify an input signal and output an amplified signal, and a modulator/exciter which, based on the setting table corresponding to the active transmitter to be switched to the backup transmitter, converts the input signal into a modulation signal of a prescribed broadcast type in which nonlinear distortion by the power amplifier has been compensated; and
a system controller which integrally controls the plurality of active transmitters and the backup transmitter, and at the time of adjusting the output level of any of the plurality of active transmitters, performs control of the backup transmitter so that content of the setting table corresponding to the active transmitter whose output level was adjusted becomes a setting value corresponding to the output level adjusted.

6. The transmission system according to claim 5, wherein: the backup transmitter has a control unit which changes the content of the setting table corresponding to the active transmitter whose output level was adjusted, in accordance with the control of the system controller.

7. The transmission system according to claim 6, wherein: the modulator/exciter has the setting table, and the modulator/exciter changes the content of the setting table corresponding to the active transmitter whose output level was adjusted by an instruction of the control unit.

8. In a control method of a transmission system having an active transmitter, a backup transmitter provided with a power amplifier and a modulator/exciter, and a system controller which integrally controls the active transmitter and the backup transmitter, the control method of a transmission system comprising:
storing, by the backup transmitter, a setting value relating to a frequency and a level of a signal outputted from the active transmitter in a setting table, which is used when an input signal is converted into a modulation signal of a prescribed broadcast type in which nonlinear distortion by the power amplifier has been compensated;
performing control of the backup transmitter by the system controller so that, at the time of adjusting the output level of the active transmitter, content of the setting table becomes a setting value corresponding to the output level adjusted; and
changing and storing by the backup transmitter so that, in accordance with the control of the system controller, the content of the setting table becomes the setting value corresponding to the output level adjusted.

9. In a control method of a transmission system having a plurality of active transmitters, a backup transmitter provided with a power amplifier and a modulator/exciter, and a system controller which integrally controls the plurality of active transmitters and the backup transmitter, the control method of a transmission system comprising:
storing, by the backup transmitter, a setting value relating to a frequency and a level of a signal outputted from each of the plurality of active transmitters in each of a plurality of setting tables corresponding to the plurality of active transmitters, which is used when an input signal is converted into a modulation signal of a prescribed broadcast type in which nonlinear distortion by the power amplifier has been compensated;

performing control of the backup transmitter by the system controller so that at the time of adjusting the output level of any of the plurality of active transmitters, content of the setting table corresponding to the active transmitter whose output level is to be adjusted becomes a setting value corresponding to the output level adjusted; and changing and storing by the backup transmitter so that, in accordance with the control of the system controller, the content of the setting table corresponding to the active transmitter whose output level was adjusted becomes the setting value corresponding to the output level adjusted.

* * * * *